United States Patent
Jäger et al.

(10) Patent No.: US 8,735,928 B2
(45) Date of Patent: May 27, 2014

(54) METHOD FOR PRODUCING A SURFACE-MOUNTABLE SEMICONDUCTOR COMPONENT

(75) Inventors: Harald Jäger, Regensburg (DE); Michael Zitzlsperger, Regensburg (DE); Markus Pindl, Tegernheim (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/807,342

(22) PCT Filed: Jun. 27, 2011

(86) PCT No.: PCT/EP2011/060732
§ 371 (c)(1), (2), (4) Date: Feb. 12, 2013

(87) PCT Pub. No.: WO2012/000943
PCT Pub. Date: Jan. 5, 2012

(65) Prior Publication Data
US 2013/0240935 A1   Sep. 19, 2013

(30) Foreign Application Priority Data
Jun. 28, 2010 (DE) .......................... 10 2010 025 319

(51) Int. Cl.
*H01L 33/60* (2010.01)
(52) U.S. Cl.
USPC ................. 257/98; 257/13; 257/79; 257/103; 257/E33.001; 257/E33.054
(58) Field of Classification Search
CPC ....................................................... H01L 27/14
USPC ...................................... 257/13, 79–103, 918, 257/E51.018–E51.022, E33.001–E33.077, 257/E33.054, E25.028, E25.032
See application file for complete search history.

(56) References Cited

U.S. PATENT DOCUMENTS

| | | | |
|---|---|---|---|
| 7,547,923 B2 * | 6/2009 | Shin et al. | ........................ 257/99 |
| 2004/0180459 A1 | 9/2004 | Hsu | |
| 2005/0045903 A1 | 3/2005 | Abe et al. | |
| 2006/0102917 A1 * | 5/2006 | Oyama et al. | ................... 257/99 |

(Continued)

FOREIGN PATENT DOCUMENTS

| | | |
|---|---|---|
| DE | 100 41 328 A1 | 3/2002 |
| DE | 101 22 002 A1 | 11/2002 |

(Continued)

OTHER PUBLICATIONS

Japanese Examination Report dated Feb. 12, 2014 for corresponding Japanese Application No. 2013-517233.

*Primary Examiner* — Mamadou Diallo
(74) *Attorney, Agent, or Firm* — DLA Piper LLP (US)

(57) ABSTRACT

A method of producing a surface-mountable semiconductor component including providing an auxiliary carrier made with a plastics material; applying at least one insert and at least one optoelectronic component to a mounting surface of the auxiliary carrier; enclosing the optoelectronic component and the insert in a common molding, wherein the molding covers the optoelectronic component and the insert form-fittingly at least in places, the optoelectronic component and the insert are not in direct contact with one another, and the optoelectronic component and the insert are connected together mechanically by the molding; removing the auxiliary carrier; and producing individual surface-mountable semiconductor components by severing the molding.

15 Claims, 4 Drawing Sheets

(56) References Cited

U.S. PATENT DOCUMENTS

| | | | |
|---|---|---|---|
| 2007/0205425 A1* | 9/2007 | Harada | 257/98 |
| 2008/0128724 A1 | 6/2008 | Isobe et al. | |
| 2008/0179617 A1 | 7/2008 | Kadotani et al. | |
| 2008/0290359 A1 | 11/2008 | Inoue et al. | |
| 2009/0097233 A1* | 4/2009 | Ooya et al. | 362/97.3 |
| 2009/0212316 A1 | 8/2009 | Braune et al. | |
| 2009/0273000 A1 | 11/2009 | Kon | |
| 2010/0295073 A1* | 11/2010 | Grotsch et al. | 257/98 |
| 2012/0001205 A1* | 1/2012 | Lee et al. | 257/89 |

FOREIGN PATENT DOCUMENTS

| | | |
|---|---|---|
| DE | 10 2004 021 233 A1 | 12/2005 |
| DE | 10 2005 041 064 A1 | 3/2007 |
| DE | 10 2006 046 678 A1 | 4/2008 |
| DE | 10 2008 010 512 A1 | 8/2009 |
| DE | 10 2009 036 621 A1 | 2/2011 |
| EP | 0 364 806 | 4/1990 |
| EP | 2 161 765 A2 | 3/2010 |
| JP | 61-1066 | 1/1986 |
| JP | 2001-111119 | 4/2001 |
| JP | 2005-26401 | 1/2002 |
| JP | 2005-79329 | 3/2005 |
| JP | 2007-81430 | 3/2007 |
| JP | 2008-199000 | 8/2008 |
| JP | 2008-270820 | 11/2008 |
| JP | 2009-506556 | 2/2009 |
| JP | 2010-28071 | 2/2010 |
| JP | 2011-103382 | 5/2011 |
| WO | 2004/004017 A2 | 1/2004 |
| WO | 2006/016398 A1 | 2/2006 |
| WO | 2009/075753 A2 | 6/2009 |
| WO | 2011/093454 A1 | 8/2011 |

* cited by examiner

METHOD FOR PRODUCING A SURFACE-MOUNTABLE SEMICONDUCTOR COMPONENT

RELATED APPLICATIONS

This is a §371 of international Application No. PCT/EP2011/060712, with an international filing date of Jun. 27, 2011 (WO 2012/000943 A1, published Jan. 5, 2012), which is based on German Patent Application No. 10 2010 025 319.7 filed Jun. 28, 2010, the subject matter of which is incorporated herein by reference.

TECHNICAL FIELD

This disclosure relates to a method for producing a surface-mountable semiconductor component and a surface-mountable semiconductor component.

BACKGROUND

There is a need for a method for producing a surface-mountable semiconductor component which saves time, is inexpensive and is of particularly space-saving and compact construction.

SUMMARY

We provide a method of producing a surface-mountable semiconductor component including providing an auxiliary carrier made with a plastics material; applying at least one insert and at least one optoelectronic component to a mounting surface of the auxiliary carrier; enclosing the optoelectronic component and the insert in a common molding, wherein the molding covers the optoelectronic component and the insert form-fittingly at least in places, the optoelectronic component and the insert are not in direct contact with one another, and the optoelectronic component and the insert are connected together mechanically by the molding; removing the auxiliary carrier and producing individual surface-mountable and semiconductor components by severing the molding.

We also provide a surface-mountable semiconductor component including at least one optoelectronic component with a radiation passage face; at least one reflector which reflects electromagnetic radiation impinging thereon and generated by the optoelectronic component when in operation, wherein the reflector surrounds the optoelectronic component in the lateral direction at least in places and the reflector is or comprises a terminal point for the optoelectronic component; a radiation-transmissive molding in direct contact at least in places with the optoelectronic component and the reflector; a bearing surface formed at least in places by a surface of the molding, wherein the optoelectronic component and the reflector are not in direct contact with one another and connect together mechanically by the molding and the reflector surrounds the optoelectronic component at least in places in the lateral direction.

We further provide a surface-mountable semiconductor component including at least one optoelectronic component with a radiation passage face; at least one insert formed of two separate components spaced from one another in lateral direction such that they form a cavity, and the insert is or comprises a terminal point for the optoelectronic component; a reflective molding in direct contact at least in places with the optoelectronic component at side faces and with the insert; a bearing surface formed at least in places by a surface of the molding, wherein the optoelectronic component and the insert are not in direct contact with one another and connect together mechanically by the molding and the radiation passage face of the optoelectronic component is free of the molding.

BRIEF DESCRIPTION OF THE DRAWINGS

FIGS. 3A to 3C are schematic side views of two examples of a surface-mountable semiconductor component described herein.

DETAILED DESCRIPTION

In a first step of our method, an auxiliary carrier may be provided which is made with a plastics material. The auxiliary carrier may consist of plastics or contain plastics. For example, the auxiliary carrier film which is made, for example, completely with a plastics material such as, for example, a silicone or a polyimide. The auxiliary carrier may also take the form of a self-supporting disk or board.

In a further step, at least one and at least one optoelectronic component are applied to a mounting surface of the auxiliary carrier. "Apply" means in this connection that the insert and/or the optoelectronic component are brought into direct contact with the mounting surface of site auxiliary carrier. It is likewise possible, for example, one or more interlayers or further components to be arranged between the optoelectronic component and/or the insert and the auxiliary carrier. The insert and/or the optoelectronic component are in this case only in indirect contact with the auxiliary carrier after application. For example, an adhesive is applied to the mounting surface of the auxiliary carrier, which may be a bonding agent between the optoelectronic component and the insert on the one hand and the auxiliary carrier on the other hand. The adhesive is to this end applied, for example, in places or all over the mounting surface of the auxiliary carrier. The adhesive comprises, for example, a silicone, an acrylic or a UV-active adhesive.

The optoelectronic component may be a radiation-receiving or a radiation-emitting semiconductor chip. The semiconductor chip is, for example, a luminescent diode chip such as for instance a light-emitting diode chip or a laser diode chip. It is additionally possible for the optoelectronic component to be a photodiode chip. In addition, the optoelectronic component may comprise a radiation-receiving and a radiation-generating semiconductor chip. It is additionally possible for the optoelectronic component to comprise luminescent diode chips suitable for generating electromagnetic radiation of different wavelengths.

"Insert" in this connection means a structurally separate component which may, for example, be applied to the mounting surface independently of the optoelectronic component. The insert may, for example, comprise additional (opto)electronic components or a carrier. It is also feasible for the insert to be or comprise a heat sink for the electronic component. After application, the optoelectronic component and the insert connect together via the mounting surface of the auxiliary carrier.

In a further step the optoelectronic component and the insert may be enclosed in a common molding, the molding covering the optoelectronic component and the insert form-fittingly at least in places, i.e. the material of the molding, the molding composition, may be at least in places in direct contact with the optoelectronic component and the insert. The molding is radiation-transmissive, for example. "Radiation-transmissive" means in this connection that the molding is then at least 80%, preferably more than 98% transmissive for electromagnetic radiation. The optoelectronic component and the insert are enclosed in the common, for example, by potting or injection, i.e. the is produced, for example, by a casting or press-molding method. The molding simultaneously provides encapsulation for the optoelectronic component and a housing for the subsequent semiconductor component. It is possible, for example, for further components to be enclosed in the common molding, in addition to the optoelectronic component and the insert.

The optoelectronic component and the insert may not be in direct contact with one another, wherein the optoelectronic component and the insert being connected mechanically together by the molding, i.e. the optoelectronic component and the insert do not touch one another at any point. The optoelectronic component and the insert are merely in indirect contact with one another through the molding. The optoelectronic component and the insert are then preferably insulated electrically from one another by the molding. The connection mediated by the molding is stable relative to external mechanical loads such as may occur when the semiconductor component is used properly such that the position of the optoelectronic component and of the insert relative to one another remains substantially the same due to the stabilising action of the molding. "Substantially" means in this connection that the position of the optoelectronic component and of the insert relative to one another remains the same unless exposed to thermal effects which may occur such as thermal deformation or expansion of the molding.

In a next step the auxiliary carrier is removed. Removal proceeds, for example, by mechanical detachment. Detachment of the auxiliary carrier proceeds, for example, by peeling the auxiliary carrier away from the molding, the optoelectronic component and the reflector. To this end, an assembly consisting of the auxiliary carrier, the molding, the optoelectronic component and the reflector may be placed on a processing surface, along which the assembly is moved. During movement of the assembly, the auxiliary carrier may be peeled off, for example, through a gap or slot introduced into the processing surface, and then rolled up.

In a further step, the molding may be severed to produce individual semiconductor components. Severing may take place before or slier removal of the auxiliary carrier. It is not absolutely necessary for semiconductor components to be produced with just one electronic component and/or insert. It is, for example, also possible for a plurality of electronic components to be combined in a single semiconductor component. Severing may proceed solely through the molding, i.e. to singulate the component, singulation does not then proceed through further electronic components and/or inserts or other components. In this case, side faces are formed completely by the molding, the side faces defining the semiconductor component at the sides in the lateral direction. The side faces may exhibit traces of the singulation process such as, for example, saw marks. "In the lateral direction" in this connection means a direction parallel to the main direction of extension of the auxiliary carrier.

An auxiliary carrier may be provided which is made with a plastics material. In a further step, at least one insert and at least one electronic component may be applied to a mounting surface of the auxiliary carrier. In a further step the electronic component and the insert may be enclosed in a common molding, the molding covering the electronic component and the insert form-fittingly at least in places. The electronic component and the insert may not be in direct contact with one another, the electronic component and the insert being joined together mechanically by the molding. In a further step the auxiliary carrier may be removed. In addition, in a further step the molding may be severed to produce individual semiconductor components.

The method described herein for producing a surface-mountable semiconductor component is based inter alia on the recognition that production of a surface-mountable semiconductor component may involve significant manufacturing effort. To make surface-mountable semiconductor components which are stable, for example relative to external mechanical action, a carrier may be provided to stabilize the semiconductor component on which carrier farther components of the semiconductor component are then applied. Moreover, this entails the disadvantage that for example, the provision and prefabrication of such a mechanically stable carrier often involves significant effort. This may result in a manufacturing process which makes production of the semiconductor component expensive and time-consuming.

To provide a method for producing a surface-mountable semiconductor component which is inexpensive and economical with regard to time, the method described herein for producing a surface-mountable semiconductor component makes use, inter alia of the concept of first producing an auxiliary carrier made with a plastics material and may be readily removed prior to or after severing.

The auxiliary carrier may have a thickness of 50 μm to 200 μm. "Thickness" here means a maximum extent of the auxiliary carrier in the vertical direction, the vertical direction being a direction perpendicular to the lateral direction. Such a range of thicknesses for the auxiliary carrier has proven very particularly advantageous since the auxiliary carrier may be removed again particularly simply after enclosure in the molding.

The insert may be a reflector which is intended to reflect electromagnetic radiation impinging thereon and generated by the optoelectronic component when in operation, the reflector surrounding the optoelectronic component in the lateral direction at least in places. Electromagnetic radiation emitted by the optoelectronic component may then impinge on the reflector and be reflected away from the optoelectronic component by the reflector.

The insert may be or may comprise a terminal point for the optoelectronic component. The insert may serve in electrical contacting of the optoelectronic component inside the subsequent semiconductor component. The terminal point is preferably situated at least in part in the molding. The terminal point or the insert is then preferably externally accessible, electrically contactable and terminates flush with an outer surface of the molding.

A carrier element may be arranged on the mounting surface of the auxiliary carrier between the auxiliary carrier and the optoelectronic component prior to enclosure, which carrier element may be or may comprise a further electrical terminal point for the optoelectronic component. The carrier element may be a metallic carrier strip (or lead frame). The carrier strip is then, for example, made with at least one strip-form metal strip which serves as the further electrical terminal point.

The electronic component, the insert and the carrier element may be enclosed in the common molding, wherein the molding covers the electronic component, the insert and the carrier element form-fittingly at least in places. The carrier element is preferably situated at least in part in the molding. The carrier element is preferably externally accessible and electrically contactable.

The insert and the carrier element may not be in direct contact with one another, the insert and the carrier element being connected together mechanically by the molding.

The carrier element may have a maximum thickness of 250 μm. The carrier element is, for example, prepatterned by an etching process. The carrier element may then comprise points that have been "thinned" in the vertical direction. Advantageously, the method allows arbitrarily prepatterned carrier elements to be enclosed in the common molding. In this respect, the production process is particularly variable since it is the molding instead of the carrier element which ensures the mechanical stability of the subsequent semiconductor component. In this way, it is possible to avoid restricting carrier element choice, for example, with regard to the thickness of the carrier element since the requirements made of the carrier element with regard to, for example, self-supporting and/or mechanical properties, may be lower.

Further a surface-mountable semiconductor component is specified. The surface-mountable semiconductor component may be produced, for example, by the method as described in conjunction with one or more of the above-stated examples, i.e. the features listed for the method described herein are also disclosed for a surface-mountable semiconductor component described herein and vice versa.

The surface-mountable semiconductor component may comprise at least one optoelectronic component with a radiation passage face. The radiation passage face may be the face through which the optoelectronic component emits and/or receives electromagnetic radiation.

The surface-mountable semiconductor component may comprise at least one reflector intended to reflect electromagnetic radiation impinging thereon and generated by the optoelectronic component when in operation.

The surface-mountable semiconductor component may comprise a radiation-transmissive molding in direct contact with the optoelectronic component and the reflector at least in places.

The surface-mountable semiconductor component may comprise a bearing surface formed at least in places by a surface of the molding. The bearing surface of the semiconductor component here means any surface of the semiconductor component which faces a carrier, for example, a printed circuit board, on which the semiconductor component is mounted. The bearing surface may here be a load-carrying surface with which the semiconductor component bears on the carrier. To this end, the bearing surface may be in mechanical contact with the carrier at least in places. It is possible for the bearing surface to be in contact with a connecting material, for example, solder via which the surface-mountable semiconductor component is electrically contacted, i.e. the connecting material then wets parts of the bearing surface and thus parts of the molding.

The optoelectronic component and the reflector may not be in direct contact with one another and may be connected together mechanically by the molding.

The reflector may surround the optoelectronic component at least in places in the lateral direction. "In the lateral direction" in this connection means a direction parallel to the main direction of extension of the semiconductor component. For example, the reflector surrounds the optoelectronic component completely in the lateral direction. It is feasible for the reflector to be circular, oval, ellipsoidal or rectangular in plan view. In addition, the reflector may consist of one or more separate parts. For example, the reflector is then a terminal point for the optoelectronic component. Preferably, the reflector on the bearing surface of the surface-mountable semiconductor component is externally accessible, i.e. the bearing surface may be formed at least in places by the reflector such that the surface-mountable semiconductor component is electrically contactable via the bearing surface.

The surface-mountable semiconductor component described herein is based inter alia on the recognition that surface-mountable semiconductor components are not very compact or economical with regard to space due to the configuration of a carrier, for example, a lead frame. To ensure mechanical stability of the semiconductor component, often such a carrier has, for example, to exhibit a given mechanical stability and/or thickness. Components applied to such a carrier then connect together mechanically stably via the carrier. However, this may lead to a semiconductor component with restricted freedom of configuration due to the specific requirements made of such a carrier. In addition, such a carrier may result in a semiconductor component which is not very compact and not very economical with regard to space. Moreover, such a semiconductor component may, for example, be difficult to handle in a subsequent mounting procedure.

To provide a surface-mountable semiconductor component which is compact and economical with regard to space, the surface-mountable semiconductor component described herein makes use inter alia of the concept of bringing an optoelectronic component and a reflector into direct contact with a molding at least in places. The molding then connects the optoelectronic component and the reflector together mechanically. In other words, such a molding assumes mechanical stabilization of the surface-mountable semiconductor component. It is then advantageously possible to dispense with an often thick carrier, so making the component particularly compact.

The surface-mountable semiconductor component may comprise at least one insert.

The optoelectronic semiconductor component may comprise a reflective molding in direct contact at least in places with the optoelectronic component at side faces and with the insert. "Reflective" means in this connection that the molding is at least 80%, preferably more than 90% reflective for electromagnetic radiation impinging thereon. The side faces of the optoelectronic component extend, for example, in a vertical direction, i.e. in a direction perpendicular to the lateral direction of the surface-mountable semiconductor component. In other words, the side faces of the optoelectronic component thus laterally define the optoelectronic component. "At least in places" may here mean that the reflective molding form-fittingly encloses the side faces of the optoelectronic component only up to a certain height and is in direct contact with the side faces. This makes it possible for the optoelectronic component itself to be concealed partially or completely at its side faces by the reflective molding. The side faces of the optoelectronic component are thus covered completely or up to a predeterminable height by the reflective molding.

The optoelectronic component and the insert may not be in direct contact with one another and may be connected together mechanically by the molding.

The radiation passage face of the optoelectronic component may be free of the molding. "Free" means that the radiation passage face is neither covered by the reflective molding nor is the reflective molding arranged downstream of the optoelectronic component, for example, along a radiation exit path of the optoelectronic component. The radiation may therefore exit unimpeded from the optoelectronic component or enter the optoelectronic component unimpeded through the radiation passage face and be detected thereby, for example. It is at most possible for material residues of the reflective molding to remain on the radiation passage face as a result of production, the residues covering at most 10%, preferably at most 5% of the radiation passage face, however.

The molding may consist of an epoxide or contain at least one epoxide, wherein light-reflecting particles are introduced into the epoxide.

Epoxides have the advantage of curing to yield a particularly mechanically strong and stable molding. In other words, a molding made with an epoxide has improved mechanical stability. The reflective molding made with the epoxide may then predominantly ensure mechanical stabilization of the semiconductor component.

The light-reflecting particles may be particles which may reflect electromagnetic radiation. In addition, the reflective particles reflect as much of the electromagnetic radiation as possible to prevent, radiation damage to the reflective molding. In other words, the reflective particles in the reflective molding may compensate for the disadvantage of the epoxide exhibiting lower radiation stability than, for example, a silicone, with regard to UV radiation. The light-reflecting particles are, for example, particles which consist of at least one of the materials $TiO_2$, $BaSO_4$, $ZnO$ or $Al_2O_3$ or contain one of the stated materials.

The molding may be made with a silicone or an epoxide into which radiation-absorbing particles are introduced. For example, the radiation-absorbing particles are carbon black particles. To an external observer the molding may then appear black or colored.

The molding may consist of a silicone or contain at least one silicone. Radiation-reflecting particles of the above-described type may be introduced into the silicone.

The molding may contain light-scattering particles. The light-scattering particles may be diffuser particles suitable, for example, for scattering radiation to be emitted or received by the electronic component.

The molding may contain light-absorbing particles. For example, such tight-absorbing particles are suitable for absorbing electromagnetic radiation of a given wavelength range. Such particles may, for example, be used in the semiconductor component as filters. If the optoelectronic component is a detector, for example, a detector is produced which exhibits particularly significant sensitivity in a given wavelength range.

The molding may contain at least one luminescence conversion material. The luminescence conversion material is preferably suitable for absorbing at least some of the electromagnetic radiation of a first wavelength range emitted by the optoelectronic component when in operation and/or to be received by the optoelectronic component and for emitting electromagnetic radiation which originates from a second wavelength range and is different from the first wavelength range.

The molding need not project laterally beyond the optoelectronic component. It is feasible for the reflective molding to terminate flush with the radiation passage face of the optoelectronic component in the vertical direction. The reflective molding then encloses the side faces of the optoelectronic component for example, completely, whereby the fraction of the radiation reflected hack by the reflective, for example, into the optoelectronic component is as large as possible. For example, the electromagnetic radiation generated by the optoelectronic component, apart from possible absorption effects of the reflective molding, is able to leave the semiconductor component only at the points intended therefor, i.e. solely through the radiation passage face. The reflective molding therefore contributes to a particularly effective increase in the radiation outcoupling efficiency of the semiconductor component.

A further radiation-transmissive molding may be applied at least in places to the radiation passage face of the optoelectronic component and exposed points of the molding. The further radiation-transmissive may consist, for example, of a silicone, an epoxide or a mixture of silicone and epoxide or contain at least one of the stated materials.

The further radiation-transmissive molding may likewise comprise light-scattering or reflective particles, light-absorbing particles and/or at least one luminescence conversion material.

A radiation outcoupling face of the further molding may be lenticular, at least in places. The radiation outcoupling face may be formed at least in places by an outer face of the further molding remote from the optoelectronic component. Advantageously, such a lenticular shape of the radiation outcoupling face increases the radiation uncoupling efficiency of the semiconductor component.

The method described herein for producing a surface-mountable semiconductor component and the surface-mountable semiconductor component described herein is explained in greater detail below with reference to examples and the associated figures.

In the examples and figures, identical or identically acting components are in each case provided with the same reference numerals. The elements shown should not be considered as being to scale, but rather individual elements may be shown exaggeratedly large to assist in understanding.

Figure 1A:
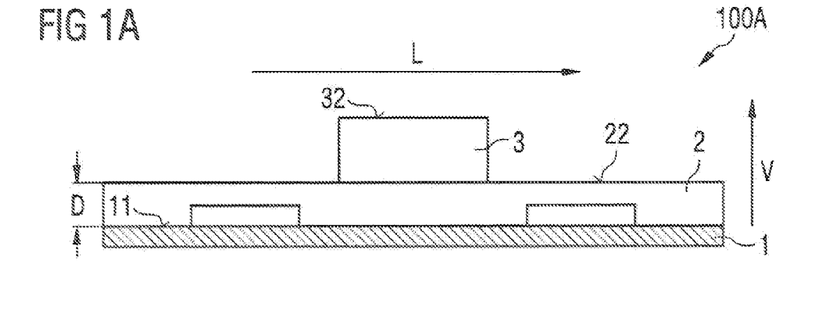
FIGS. 1A to 1G, 2A and 2B and schematic views of individual manufacturing steps for producing to examples of a surface-mountable semiconductor component described herein.

FIG. 1A is first of all a schematic side view of how a carrier element 2 is applied to a mounting surface 11 of an auxiliary carrier 1. The auxiliary carrier 1 is made with a plastics material such as, for example, silicone, a polyimide, an acrylic, or a radiation-active film. In other words, the auxiliary carrier 1 is a plastics film. The carrier element 2 exhibits a maximum thickness D of 250 μm. The carrier element 2 is made with copper, for example. An optoelectronic component 3 is applied to a mounting surface 22 of the carrier element 2, the component comprising a radiation passage face 32. The radiation passage face 32 is an outer face, remote from the auxiliary carrier 1, of the optoelectronic component 3. The optoelectronic component 3 is a radiation-emitting semiconductor chip, for example. It is likewise feasible for the electronic component 3 to be a radiation-receiving component, for example, a photodetector. The auxiliary carrier 1, the carrier element 2 and the optoelectronic component 3 together form an assembly 100A.

Figure 1B:
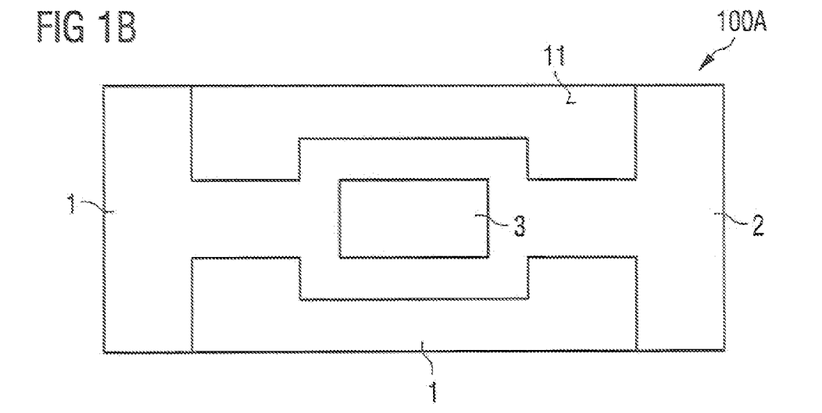

FIG. 1B is a schematic plan view of the assembly 100A. It is apparent that the auxiliary carrier 1 and the carrier element 2 are not completely congruent in a vertical direction V, i.e. the mounting surface 11 is at least in places free of the carrier element 2.

Figure 1C:
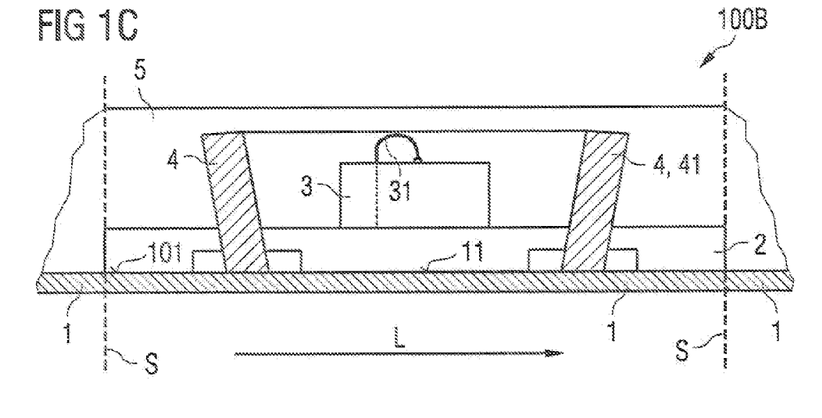

FIG. 1C shows, in a schematic sectional representation, how an insert 4, in this example a reflector 41, is applied to the mounting surface 11 of the auxiliary carrier 1. The reflector 41 and the carrier element 2 are not in direct contact with one another and thus do not touch one another. In addition, the reflector 41 completely surrounds the optoelectronic component 3 in the lateral direction L. By a bonding, wire contact 31, the optoelectronic component 3 is electrically contacted with the reflector 41 (concealed in the figure). FIG. 1C additionally shows how the optoelectronic component 3, the reflector 41 and the carrier element 2 are enclosed in a common radiation-transmissive molding 5. The molding 5 covers all exposed points of the optoelectronic component 3, of the reflector 41 and of the carrier element 2 form-fittingly and completely. The molding 5 connects the optoelectronic component 3, the reflector 41 and the carrier element 2 together mechanically. In other words, FIG. 1C shows an assembly 100B consisting of the assembly 100A and the molding 5. In a subsequent step, the auxiliary carrier 1 may then be removed from the molding 5 and the carrier element 2. Finally, surface-mountable semiconductor components 100 may be produced by severing the molding 5 along the dividing lines S.

If the assembly 100A comprises, for example, a plurality of optoelectronic components 3, it is conceivable that each optoelectronic component 3 is, for example, completely surrounded by a reflector 41 uniquely assigned thereto. The optoelectronic components 3 and the reflector 41 may then be arranged in each case in pairs adjacent one another in the lateral direction L. For example, severing is then performed in the vertical direction V through the molding 5 and/or the carrier element 2, between each reflector 41.

Figure 1D:
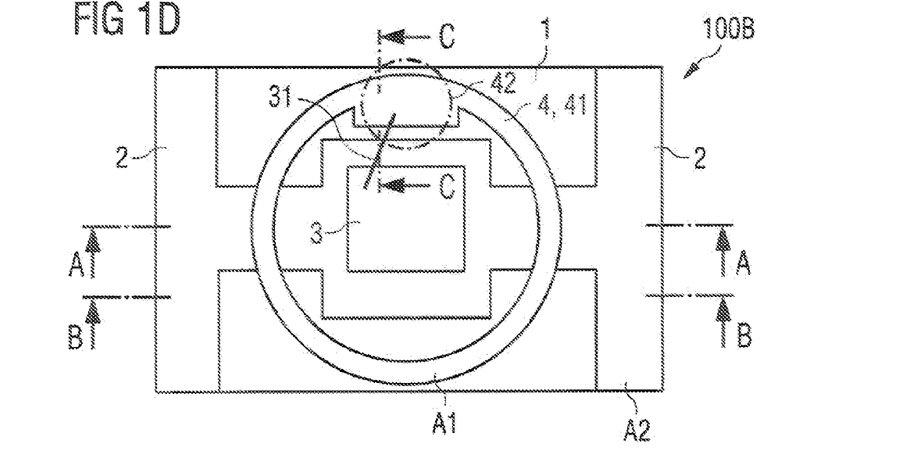

FIG. 1D is a schematic plan view of the assembly 100B shown in FIG. 1C, wherein the molding 5 is not shown to simplify the drawing. It is apparent that the reflector 41 completely surrounds the optoelectronic component 3 in the lateral direction L. The reflector 41 is here of circular construction and comprises a bonding wire terminal zone 42. In other words, the reflector 41 is a terminal point A1 for the optoelectronic component 3.

Figure 1E:
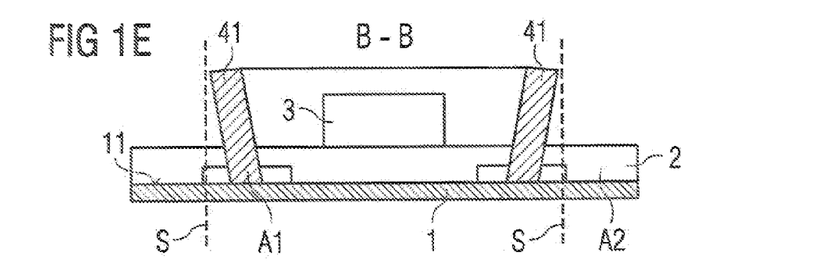
Figure 1F:
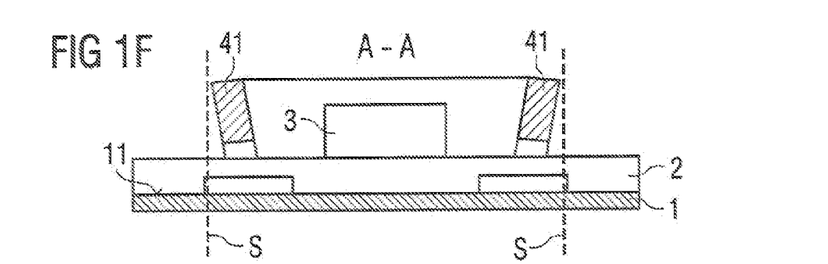
Figure 1G:
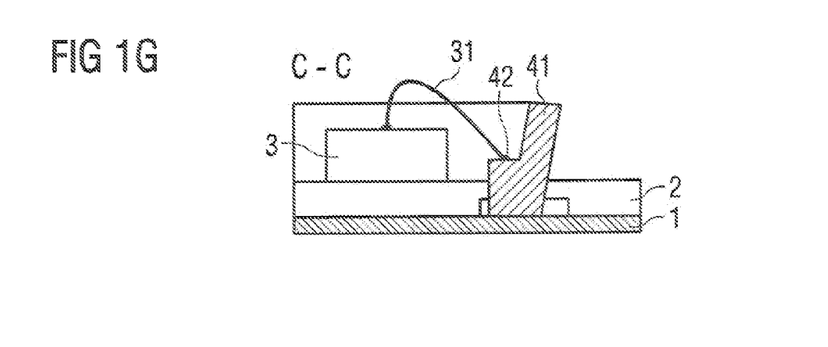

FIGS. 1F to 1G show schematic lateral sectional representations of the assembly 100B along section lines A-A, B-B, C-C shown in FIG. 1D.

FIG. 1E shows, in a lateral view along section line B-B, that the reflector 41 is in direct contact with the mounting surface 11 of the auxiliary carrier 1.

In addition, FIG. 1F shows, in a lateral view along section line A-A, that in regions of the assembly 100B in which the reflector 41 overlaps the carrier element 2 in the vertical direction V, the reflector 41 is arranged at a distance from the carrier element 2, i.e. the reflector 41 and the optoelectronic component 3 do not touch one another at any point and are therefore electrically insulated from one another. The carrier element 2 may then form a further electrical terminal A2 for the electronic component 3.

FIG. 1G shows, in a lateral view along section line C-C, how the bonding wire contact 31 is mounted to the bonding wire terminal zone 42 of the reflector 41.

Figure 2A:
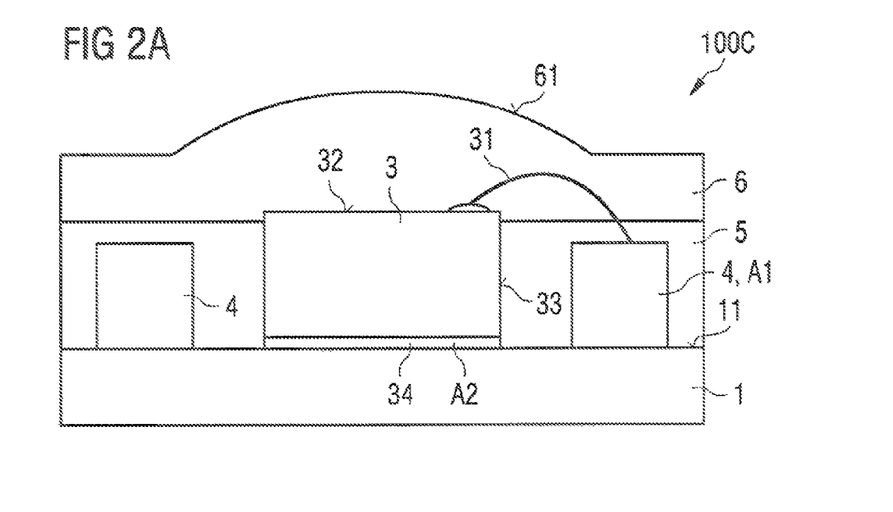
Figure 2B:
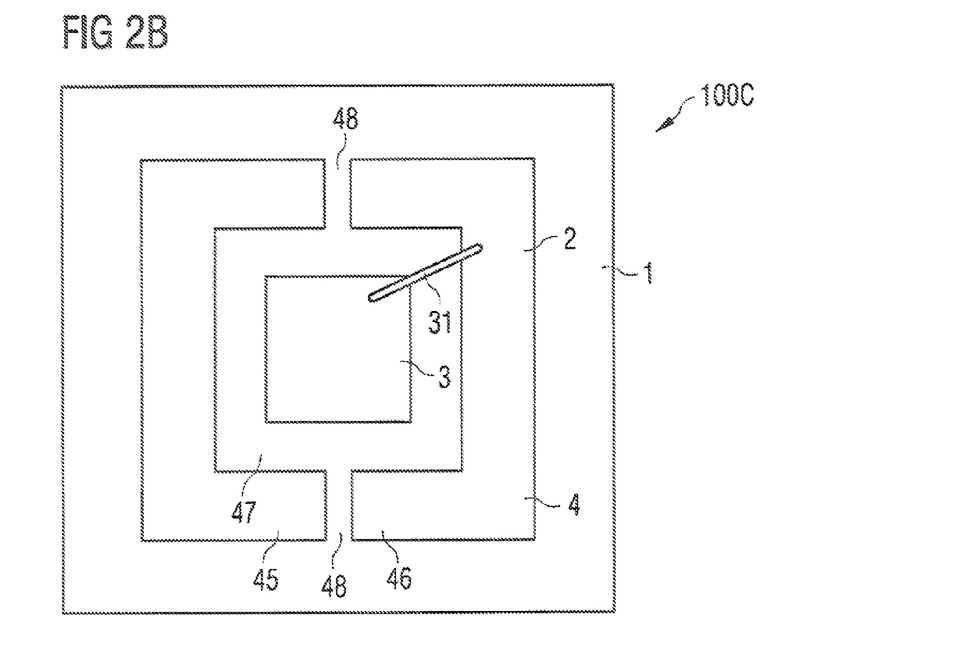

FIGS. 2A and 2B are schematic views of manufacturing steps of a further example of the method described herein for producing the surface-mountable semiconductor component 100.

It is apparent that the optoelectronic component 3 is partially enclosed form-fittingly at side faces 33 by the molding 5, the molding 5 here being reflective. The molding 5 is made with an epoxide or a silicone into which light reflective particles have been introduced. The light-reflecting particles are, for example, particles which consist of at least one of the materials $TiO_2$, $BaSO_4$, ZnO or $Al_2O_3$ or contain one of the stated materials.

The radiation passage face 32 is moreover free of the reflective molding 5. In addition, an insert 4 is applied to the mounting surface 11 of the auxiliary carrier 1, which insert forms the first electrical terminal A1 for the optoelectronic component 3. The bonding wire contact 31 contacts the optoelectronic component 3 electrically with the insert 4. The insert 4 is, for example, made with a copper or coated with copper. In addition, an electrical contact layer 34 is applied to an outer surface of the optoelectronic component 3 facing the auxiliary carrier 1, between the optoelectronic component 3 and the auxiliary carrier 1, which layer forms the further electrical terminal A2 for the optoelectronic component 3. The insert 4 is completely and form-fittingly covered at exposed points by the reflective molding 5. A further radiation-transmissive molding 6 is applied to the radiation passage face 32 of the optoelectronic component 3 and exposed points of the reflective molding 5, a radiation outcoupling face 61 of the further radiation-transmissive molding 6 being of lenticular construction. The auxiliary carrier 1, the optoelectronic component 3, the insert 4 and the two moldings 5 and 6 form an assembly 100C.

After removal of the auxiliary carrier 1, the surface-mountable semiconductor component 100 may then be produced by severing the moldings 5 and 6.

FIG. 2B is a plan view of the assembly 100C shown in FIG. 2A. It is apparent that the bonding wire contact 31 connects the optoelectronic component 3 and the insert 4 electrically together. It is additionally apparent that the insert 4 is formed of two separate components 45 and 46 spaced from one another in the lateral direction L, which components are each U-shaped. The two components 45, 46 are arranged such that they form a cavity 47, which is defined in lateral direction L by the components 45 and 46 and in vertical direction V by the mounting surface 11 and by an opening located opposite to the mounting surface 11. Inside the cavity 47 the optoelectronic component 3 is arranged on the mounting surface 11 of the auxiliary carrier 1. Such a cavity 47 may, as shown in FIG. 2B, comprise openings 48 from which the cavity 47 is opened and/or may be seen into. It is likewise feasible for the insert 4 to surround the optoelectronic component 3 completely in the lateral direction L and then to be formed by a single, continuous component.

Figure 3A:
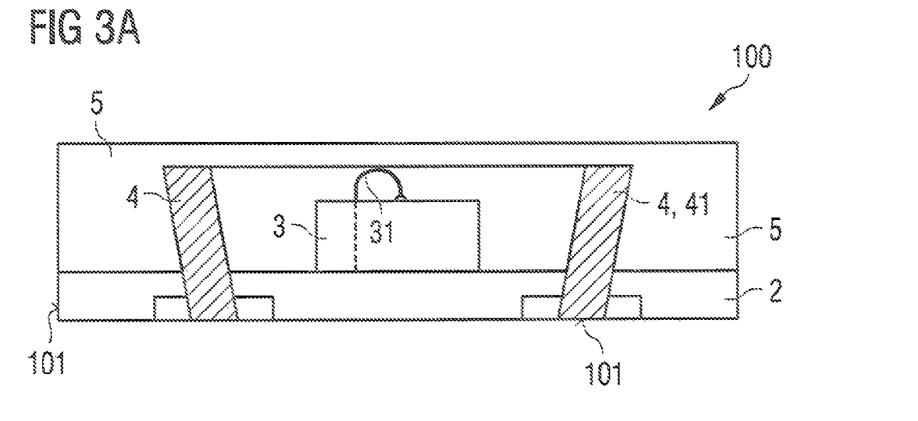
Figure 3B:
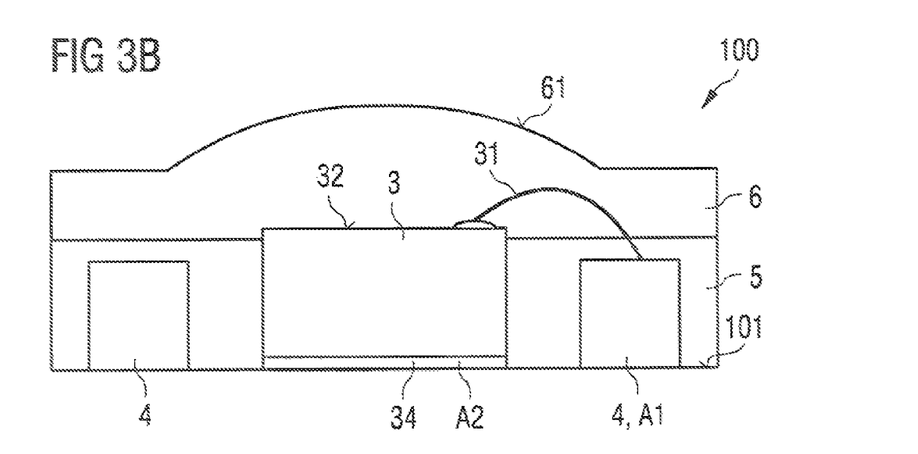

FIGS. 3A to 3C are schematic side views of examples of a surface-mountable semiconductor component 100 described herein.

The surface-mountable semiconductor component 100 shown in FIG. 3A comprises a bearing surface 101. The bearing surface 101 is formed by the reflector 41, the carrier element 2 and the radiation-transmissive molding 5. In other words, the surface-mountable semiconductor component 100 is electrically contactable from outside via the bearing surface 101. The surface-mountable semiconductor component 100 is produced, for example, by the method described in relation to FIGS. 1A to 1G.

In the example illustrated in FIG. 3B, the carrier element 2 is dispensed with, the electrical contact layer 34 being applied to the outer face of the optoelectronic component 3 remote from the radiation passage face 32, i.e. in this case the bearing surface 101 is formed in places by the electrical contact layer 34 instead of by the carrier element 2, the contact layer 34 here forming the further electrical terminal A2 for the optoelectronic component 3. The surface-mountable semiconductor component 100 is produced, for example, by the method described in relation to FIGS. 2A to 2B.

Our methods and components described herein are not restricted by the description given with reference to the examples. Rather, this disclosure encompasses any novel feature and any combination of features, including in particular any combination of features in the appended claims. This is the case even if the feature or combination is not itself explicitly indicated in the claims or examples.

The invention claimed is:

1. A method of producing a surface-mountable semiconductor component comprising:
    providing an auxiliary carrier made with a plastics material and a carrier element on the auxiliary carrier;
    applying at least one insert and at least one optoelectronic component to a mounting surface of the auxiliary carrier, wherein the at least one insert and the carrier element are not in direct contact with one another;

enclosing the optoelectronic component and the insert in a common molding, wherein the molding covers the optoelectronic component and the insert form-fittingly at least in places, the optoelectronic component and the insert are not in direct contact with one another, and the optoelectronic component and the insert are connected together mechanically by the molding;

removing the auxiliary carrier; and producing individual surface-mountable semiconductor components by severing the molding.

2. The method according to claim 1, wherein the auxiliary carrier has a thickness of 50 μm to 200 μm.

3. The method according to claim 1, wherein the insert is a reflector which reflects electromagnetic radiation impinging thereon and generated by the optoelectronic component when in operation, the reflector surrounding the optoelectronic component in the lateral direction at least in places.

4. The method according to claim 1, wherein the insert is or comprises a terminal point for the optoelectronic component.

5. The method according to claim 1, further comprising a carrier element arranged on the mourning surface of the auxiliary carrier between the auxiliary carrier and the optoelectronic component prior to enclosure, which carrier element is or comprises a further electrical terminal point for the optoelectronic component.

6. The method according to claim 5, wherein 1) the optoelectronic component, the insert and the carrier element are enclosed in the common molding, 2) the moulding covers the optoelectronic component, the insert and the carrier element form-fittingly at least in places, 3) the insert and the carrier element are not in direct contact with one another, and 4) the insert and the carrier element connect together mechanically by the molding.

7. The method according to claim 5, wherein the carrier element has a maximum thickness of 250 μm.

8. The surface-mountable semiconductor component comprising:

a carrier element;

at least one optoelectronic component with a radiation passage face;

at least one reflector which reflects electromagnetic radiation impinging thereon and generated by the optoelectronic component when in operation, wherein the reflector surrounds the optoelectronic component in the lateral direction at least in places and the reflector is or comprises a terminal point for the optoelectronic component;

a radiation-transmissive molding in direct contact at least in places with the optoelectronic component and the reflector;

a bearing surface formed at least in places by a surface of the molding, wherein the optoelectronic component and the reflector are not in direct contact with one another and connect together mechanically by the molding, the reflector surrounds the optoelectronic component at least in places in the lateral direction; and the reflector and the carrier element are not in direct contact with one another.

9. The surface-mountable semiconductor component according to claim 8, wherein the molding consists of an epoxide or contains at least one epoxide, and light-reflecting particles are introduced into the epoxide.

10. The surface-mountable semiconductor component according to claim 8, wherein the molding does not project laterally beyond the optoelectronic component.

11. The surface-mountable semiconductor component according to claim 8, wherein a further radiation-transmissive molding is applied at least in places to the radiation passage face of the optoelectronic component and exposed points of the molding.

12. A surface-mountable semiconductor component comprising:

at least one optoelectronic component with a radiation passage face;

at least one insert formed of two separate components spaced from one another in lateral direction such that they term a cavity, and the insert is or comprises a terminal point for the optoelectronic component;

a reflective molding in direct contact at least in laces with the optoelectronic component at side faces and with the insert;

a bearing surface formed at least in places by a surface of the reflective molding, wherein the optoelectronic component and the insert are not in direct contact with one another and connect together mechanically by the reflective molding, and the radiation passage face of the optoelectronic component is free of the reflective molding.

13. The surface-mountable semiconductor component according to claim 12, wherein the reflective molding consists of an epoxide or contains at least one epoxide, and light-reflecting particles are introduced into the epoxide.

14. The surface-mountable semiconductor component according to claim 12, wherein the reflective molding does not project laterally beyond the optoelectronic component.

15. The surface-mountable semiconductor component according to claim 12, wherein a further radiation-transmissive molding is applied at least in places to the radiation passage face of the optoelectronic component and exposed points of the reflective molding.

* * * * *

UNITED STATES PATENT AND TRADEMARK OFFICE
CERTIFICATE OF CORRECTION

PATENT NO. : 8,735,928 B2
APPLICATION NO. : 13/807342
DATED : May 27, 2014
INVENTOR(S) : Jäger et al.

Page 1 of 1

It is certified that error appears in the above-identified patent and that said Letters Patent is hereby corrected as shown below:

In the Claims

Column 11, Claim 5, line 23, please change "further comprising a" to --wherein the--;

Claim 5, line 24, please change "mourning surface" to --mounting surface--;

Claim 6, line 29, please change "claim 5" to --claim 1--;

Claim 6, line 31, please change "moulding" to --molding--;

Claim 6, lines 33 and 34, please delete "the insert and the carrier element are not in direct contact with one another, and 4)"; and Claim 6, at line 35, please change "element connect" to --element are connected--.

Column 12, Claim 12, line 30, please change "laces" to --places--.

Signed and Sealed this
Twenty-first Day of October, 2014

Michelle K. Lee
*Deputy Director of the United States Patent and Trademark Office*